United States Patent
Martin et al.

(10) Patent No.: US 10,504,879 B2
(45) Date of Patent: Dec. 10, 2019

(54) LIGHT-EMITTING COMPONENT AND METHOD FOR PRODUCING A LIGHT-EMITTING COMPONENT

(71) Applicant: OSRAM Opto Semiconductors GmbH, Regensburg (DE)

(72) Inventors: Alexander Martin, Sinzing (DE); Norwin Von Malm, Nittendorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/757,970

(22) PCT Filed: Sep. 8, 2016

(86) PCT No.: PCT/EP2016/071215
§ 371 (c)(1),
(2) Date: Mar. 6, 2018

(87) PCT Pub. No.: WO2017/046000
PCT Pub. Date: Mar. 23, 2017

(65) Prior Publication Data
US 2018/0254264 A1 Sep. 6, 2018

(30) Foreign Application Priority Data
Sep. 18, 2015 (DE) .......... 10 2015 115 812

(51) Int. Cl.
*H01L 25/16* (2006.01)
*H01L 27/15* (2006.01)
(Continued)

(52) U.S. Cl.
CPC .......... *H01L 25/167* (2013.01); *H01L 27/156* (2013.01); *H01L 33/08* (2013.01);
(Continued)

(58) Field of Classification Search
CPC ..... H01L 25/167; H01L 27/156; H01L 33/08; H01L 33/62
See application file for complete search history.

(56) References Cited

U.S. PATENT DOCUMENTS

| | | | | |
|---|---|---|---|---|
| 5,955,733 A | * | 9/1999 | Orava | H01L 27/14603 250/370.08 |
| 6,775,308 B2 | * | 8/2004 | Hamster | G02B 6/4204 257/E25.032 |

(Continued)

FOREIGN PATENT DOCUMENTS

| DE | 102011102032 A1 | 11/2012 |
|---|---|---|
| DE | 102011056888 A1 | 6/2013 |

(Continued)

OTHER PUBLICATIONS

Audi Matrix LED Headlights, https://web.archive.org/web/20160816181515/http:/www.audi.de/de/brand/de/vorsprung_durch_technik/content/2013/08/Audi-A8-erstrahlt-in-neuem-Licht.html, Aug. 16, 2016; Translation: http://originwww2.audi.com/sea/brand/sg/models/vorsprung-durchtechnik/content/2013/10/audia8-in-a-new-radiant-light.html, Jan. 19, 2018.

(Continued)

*Primary Examiner* — Ida M Soward
(74) *Attorney, Agent, or Firm* — McDermott Will & Emery LLP

(57) ABSTRACT

The invention relates to a component with at least one optoelectronic semiconductor chip, comprising: a connection substrate, which has an assembly surface and electric contact structures, and a plurality of structured semiconductor units, each of which has a plurality of monolithically connected pixels with a respective active layer that emits light during operation, wherein: the semiconductor units are arranged at a lateral distance to one another on the assembly surface, the distance between adjacent semiconductor units (Continued)

is at least 5 μm and maximally 55 μm, and the pixels can be controlled in an electrically separated manner. The invention also relates to a method for producing said component.

18 Claims, 5 Drawing Sheets

(51) Int. Cl.
*H01L 33/08* (2010.01)
*H01L 33/62* (2010.01)
H01L 25/075 (2006.01)
H01L 33/00 (2010.01)

(52) U.S. Cl.
CPC ......... *H01L 33/62* (2013.01); *H01L 25/0753* (2013.01); *H01L 33/0079* (2013.01)

(56) References Cited

U.S. PATENT DOCUMENTS

| | | | |
|---|---|---|---|
| 7,078,791 B1* | 7/2006 | Tindle | H01L 27/14618 |
| | | | 257/433 |
| 7,342,563 B2* | 3/2008 | Eguchi | G02F 1/1309 |
| | | | 345/55 |
| 7,388,185 B2* | 6/2008 | Nygard | H01L 27/14634 |
| | | | 250/208.1 |
| 8,664,668 B2* | 3/2014 | Ogihara | B41J 2/45 |
| | | | 257/88 |
| 8,679,888 B2* | 3/2014 | Rogers | H01L 31/035281 |
| | | | 136/261 |
| 9,853,197 B2* | 12/2017 | Odnoblyudov | H01L 33/62 |
| 9,980,633 B2* | 5/2018 | Blanquart | H01L 27/14601 |
| 10,064,269 B2* | 8/2018 | Rogers | H01L 21/4867 |
| 2003/0157437 A1* | 8/2003 | Yamamoto | H01L 21/561 |
| | | | 430/311 |
| 2007/0019430 A1 | 1/2007 | Meyrenaud | |
| 2007/0181781 A1* | 8/2007 | Feldman | G01J 1/02 |
| | | | 250/214 R |
| 2010/0006873 A1* | 1/2010 | Raring | H01L 27/153 |
| | | | 257/90 |
| 2011/0180804 A1* | 7/2011 | Su | H05B 33/0803 |
| | | | 257/76 |
| 2012/0223875 A1 | 9/2012 | Lau et al. | |
| 2014/0117386 A1* | 5/2014 | Rol | H01L 25/0753 |
| | | | 257/88 |
| 2014/0186979 A1 | 7/2014 | Tu et al. | |
| 2015/0123695 A1* | 5/2015 | Behfar | H01S 5/20 |
| | | | 324/762.01 |
| 2016/0010805 A1* | 1/2016 | Tischler | H01L 27/156 |
| | | | 362/231 |
| 2016/0104696 A1* | 4/2016 | LaVeigne | H01L 25/167 |
| | | | 257/88 |
| 2016/0143110 A1* | 5/2016 | Odnoblyudov | H05B 33/0869 |
| | | | 315/151 |

FOREIGN PATENT DOCUMENTS

| | | |
|---|---|---|
| DE | 102013102667 A1 | 10/2014 |
| JP | 2009016093 A | 1/2009 |
| JP | 2015018948 A | 1/2015 |
| WO | 80/00897 A1 | 5/1980 |
| WO | 2008/109296 A1 | 9/2008 |
| WO | 2012/156121 A1 | 11/2012 |
| WO | 2014/139849 A1 | 9/2014 |

OTHER PUBLICATIONS

Notification of Reasons for Refusal dated Feb. 18, 2019 in JP Patent Application No. 2018-513802.
Decision of Refusal received in Japanese Patent Application No. 2018-513802 dated Aug. 26, 2019.

* cited by examiner

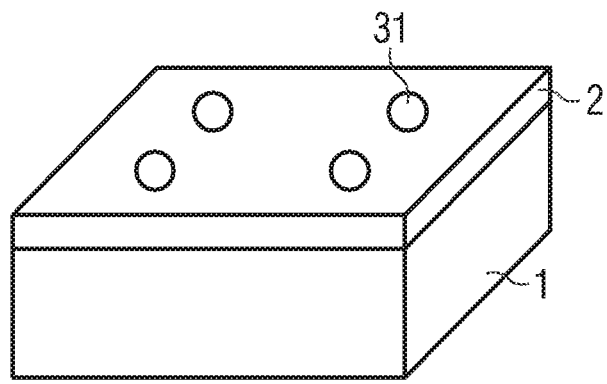
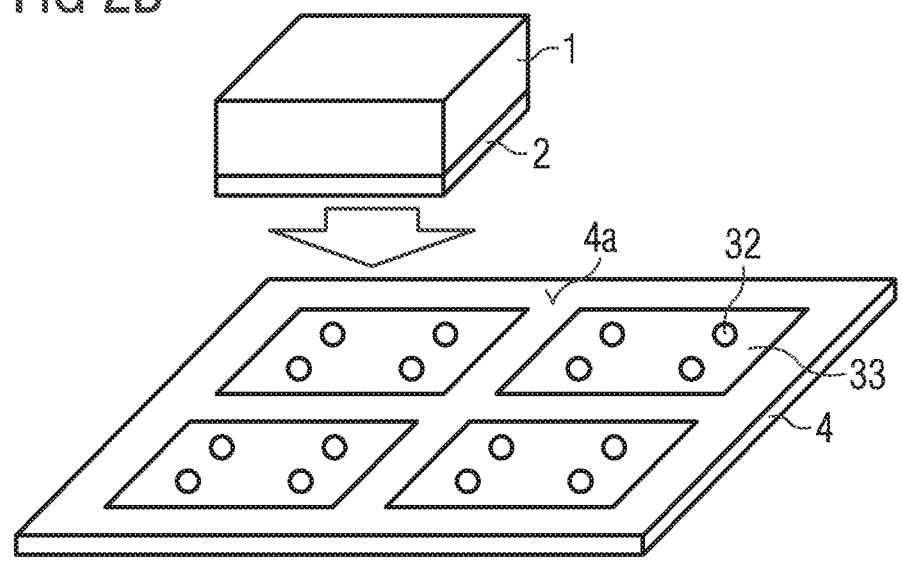

LIGHT-EMITTING COMPONENT AND METHOD FOR PRODUCING A LIGHT-EMITTING COMPONENT

CROSS-REFERENCE TO RELATED APPLICATIONS

This application is the U.S. National Phase under 35 U.S.C. § 371 of International Patent Application No. PCT/EP2016/071215, filed on Sep. 8, 2016 which in turn claims the benefit of German Application No. 10 2015 115 812.4, filed on Sep. 18, 2015, the entire disclosures of which Applications are incorporated by reference herein.

A component and a method for producing a component are provided.

The document DE 10 2011 056 888 A1 describes a component and a method for producing a component.

An object to be achieved consists in providing a component having reduced production costs. Furthermore, a method for producing a component having reduced production costs is to be provided.

A component is provided. The component is intended in particular for emitting light. For example, the component is a light source. In particular, the component can be a headlight, in particular an adaptive automotive headlight (Adaptive Front-lighting System, AFS).

According to at least one embodiment of the component, this comprises at least one optoelectronic semiconductor chip, also referred to below as a "semiconductor chip". The semiconductor chip is intended in particular to emit light. For example, the semiconductor chip is a pixelated LED chip. "Pixelated" here and below can mean that the LED chip comprises a plurality of, in particular separately electrically controllable, image points.

According to at least one embodiment, the semiconductor chip comprises a connection substrate. The connection substrate comprises a mounting surface and electrical contact structures. The electrical contact structures can be intended for the electrical contacting of the semiconductor chip. For this purpose, the electrical contact structures can comprise an electrically conductive material, such as e.g. a metal, or can consist of such a material.

The connection substrate comprises a main extension plane in which it extends in lateral directions. Perpendicular to the main extension plane, in a vertical direction, the connection substrate has a thickness. The thickness of the connection substrate is small relative to the maximum extension of the connection substrate in the lateral directions. A main plane of the connection substrate forms the mounting surface.

The connection substrate can be formed as a mechanically stabilizing constituent of the semiconductor chip. "Mechanically stabilizing" here and below means that the mechanical handling of the semiconductor chip is improved by the stabilizing part of the package and thus e.g. a higher external force can act on the semiconductor chip without its being destroyed. In particular, the semiconductor chip can become mechanically self-supporting through the connection substrate, i.e. the semiconductor chip can be handled during a manufacturing process with tools, such as e.g. tweezers, without the need for a further supporting element to be present.

According to at least one embodiment, the semiconductor chip comprises a plurality of structured semiconductor units. Each of the semiconductor units comprises a plurality of monolithically integrated image points each having an active layer, which emits light during operation. The image points can in particular be pixels, i.e. separate emission regions of the semiconductor unit. Each image point can comprise a light exit surface facing away from the connection substrate. Here it is possible that the light emitted by the active layer is coupled out of the image points through the light exit surface.

"Monolithically integrated" can mean here and below that the image points are formed from a single semiconductor layer sequence, in particular one that is in a coherent form. In particular, the image points can be produced from a monolithic semiconductor layer sequence. For example, it is possible that, to produce the image points, the semiconductor layer sequence is first applied on a growth substrate and the image points are prepared by means of a subsequent, at least partial, singulation of the semiconductor layer sequence.

For example, the semiconductor layer sequence is formed using an n-type semiconductor layer, an active semiconductor layer and a p-type semiconductor layer. The active layers of the image points can have originated from the active semiconductor layer. Furthermore, the image points can each comprise a p-type layer and an n-type layer, which originated from the p-type semiconductor layer and the n-type semiconductor layer. The fact that a layer "originated" from a semiconductor layer can mean here and below that the layer was created by singulation of the semiconductor layer and is part of the semiconductor layer. Here it is possible that some of the image points are connected to one another by means of at least one common semiconductor layer, which can be the n-type or the p-type semiconductor layer. In particular, the image points can be connected to one another by multiple semiconductor layers, e.g. the n-type semiconductor layer, the p-type semiconductor layer and the active layer.

According to at least one embodiment, the semiconductor units are arranged on the mounting surface at a distance from one another laterally. In other words, there is a trench between the semiconductor units. In particular, it is possible that image points of adjacent semiconductor units are not monolithically integrated and/or are not connected to one another by means of semiconductor material.

According to at least one embodiment, a distance between adjacent semiconductor units is at least 5 µm and no more than 55 µm, preferably at least 10 µm and no more than 20 µm. The distance is in particular the smallest distance between side faces of two adjacent semiconductor units in the lateral directions. The side faces of the semiconductor units can be outer surfaces of the semiconductor units running along the vertical direction.

According to at least one embodiment, the image points are separately electrically controllable. In particular, it is possible that at least one electrical contact structure is uniquely associated with each image point. In this way, it can be possible to switch the emission of individual image points on and off in a targeted manner. Two or more of the image points can thus be operated at the same time and at different times.

According to at least one embodiment of the component, this comprises at least one optoelectronic semiconductor chip having a connection substrate with a mounting surface and electrical contact structures and a plurality of structured semiconductor units, each comprising a plurality of monolithically integrated image points each having an active layer which emits light during operation. The semiconductor units of the semiconductor chip are arranged on the mounting surface at a distance from one another laterally. A distance between adjacent semiconductor units is at least 5 µm and no more than 55 µm. Furthermore, the image points are separately electrically controllable.

According to at least one embodiment of the component, the active layers of the image points are in a monolithically integrated form. For example, the active layers are part of a single active semiconductor layer. Furthermore, the image points are separately electrically controllable by means of multiple laterally spaced semiconductor contacts. A lateral distance between adjacent semiconductor contacts is at least 1 µm and no more than 25 µm. For example, each image point is electrically connected to at least one semiconductor contact. Furthermore, the electrical contact structure associated with an image point can be electrically connected to the semiconductor contact of the respective image point. The semiconductor contacts can be formed using an electrically conductive material, such as e.g. a metal, or can consist thereof. In particular, the component can comprise multiple semiconductor contacts, each of which is associated with at least one image point. For example, the semiconductor contacts are arranged at a distance from one another laterally on a base surface facing towards the connection substrate and/or on the light passage surface of the image points.

According to at least one embodiment, a separation trench is arranged between the active layers of adjacent image points in each case. It is possible that the active layers of the image points are not connected to one another. In particular, an active layer can be uniquely associated with each image point. The active layers can be surrounded by the separation trenches for example in the manner of a frame. "In the manner of a frame" means here and below that each image point and/or each active layer is completely surrounded by separation trenches in lateral directions in a top view of the mounting surface. In the top view, the separation trenches then appear as a lattice or network, wherein the image points are enclosed by individual meshes of the lattice or network. The separation trenches may have been created e.g. by means of etching.

According to at least one embodiment, the width of a separation trench is at least 1 µm and no more than 25 µm, preferably at least 5 µm and no more than 20 µm. The width of a separation trench is in particular the smallest extension of the separation trenches lateral directions. In particular, the width of a separation trench is the smallest distance between side faces of two adjacent image points in lateral directions. The side faces of the image points can be outer surfaces of the image points running along the vertical direction.

According to at least one embodiment, the image points are optically separate from one another. An optical separation of the image points can be achieved e.g. by means of the separation trenches. It is furthermore possible that absorbing and/or reflective material is arranged between adjacent image points. A material is "absorbing" or "reflective" here and below if it has, respectively, a transmittance of no more than 0.4, preferably no more than 0.3, or a reflectance of at least 0.5, preferably at least 0.7 and particularly preferably at least 0.85, for the radiation emitted by the active layers. Owing to the optical separation of the image points in conjunction with the capacity for separate electrical activation, it is possible e.g. to cause only individual regions of the component to emit light in a targeted manner.

According to at least one embodiment, at least two of the semiconductor units have different numbers of image points. For example, it is possible to assign at least one semiconductor unit to a first group of semiconductor units and at least one further semiconductor unit to a second group of semiconductor units. The semiconductor units of the first group can each have a first number of image points and the semiconductor units of the second group can each have a second number of image points, the first number differing from the second number.

It is possible that semiconductor units having different numbers of image points have different sizes. The size of a semiconductor unit and/or of an image point here and below is the respective extension of the semiconductor unit and/or of the image point in lateral directions. Here it is possible that the image points have different sizes. Alternatively, the image points of the different semiconductor units can have the same size within the limits of manufacturing tolerances.

Alternatively, it is possible that semiconductor units having different numbers of image points have the same size within the limits of manufacturing tolerances. In this case, the image points can have different sizes.

According to at least one embodiment, the connection substrate comprises at least one integrated circuit. For example, the connection substrate comprises doped regions by means of which switching operations are enabled. In particular, the integrated circuit can be the electrical contact structures of the connection substrate. For example, the connection substrate comprises transistors, capacitors, resistors and/or other electronic components as integrated circuits. The connection substrate can be formed using silicon or can consist thereof. In particular, the connection substrate can be an active matrix silicon substrate. An active matrix silicon substrate can contain a matrix of transistors, by means of which the individual image points can be controlled. The transistors may have been produced using e.g. CMOS or thin-film technology.

According to at least one embodiment, the connection substrate contains a plurality of current sources. Each of the current sources is uniquely associated with one of the image points. Furthermore, each of the current sources is electrically connected to the image point associated therewith. In particular, each image point is electrically connected to a current source. The current source can be e.g. a miniaturized current source.

According to at least one embodiment, the distance between adjacent semiconductor units deviates by no more than +/−10% from an average width of the separation trenches. The distance between adjacent semiconductor units can correspond to the average width of the separation trenches within the limits of manufacturing tolerances. In other words, image points of adjacent semiconductor units can be at substantially the same distance apart as image points of the same semiconductor unit. The average width of the separation trenches can be e.g. an arithmetic mean of the respective widths of the separation trenches. In particular, it is possible that both the distance between adjacent semiconductor units and the width of the separation trenches are at least 5 µm and no more than 55 µm.

According to at least one embodiment, the distances between adjacent semiconductor units deviate by no more than +/−10% from an average distance between adjacent semiconductor units. The average distance between adjacent semiconductor units can be an arithmetic mean of the respective distances between the semiconductor units. In other words, the semiconductor units are positioned on the connection substrate at regular distances from one another.

According to at least one embodiment, a light-emitting surface area of the component is at least 8 mm$^2$, preferably at least 32 mm$^2$. The light-emitting surface area of the component is in particular the sum of all light exit surface areas of the image points of the component.

According to at least one embodiment, the total number of image points is at least 128, preferably at least 2048, and/or the luminous flux of light emitted by the total number of image points is at least 1600 lumen, preferably at least 6400 lumen. The component can be e.g. a high-resolution light source and/or a light source with a high luminous density. In particular, the production of a single pixelated semiconductor unit having a luminous flux of over 6400 lumen could not be achieved with economically viable yields. The division of the component into individual semiconductor units here, each having a plurality of image points, permits cost-effective and economically viable production of a component having high resolution and/or high luminous flux.

According to at least one embodiment, the component comprises at least two semiconductor chips. Each of the semiconductor chips can be constructed as described above. In particular, each semiconductor chip comprises a plurality of semiconductor units, which are arranged on a connection substrate.

According to at least one embodiment, the at least two semiconductor chips are arranged on a printed circuit board. A printed circuit board can be e.g. a metal-core printed circuit board or a so-called submount. The printed circuit board can be intended in particular for the electrical control and/or cooling of the semiconductor chips arranged on the printed circuit board.

Furthermore, a method for producing a component is provided. The component can preferably be produced by a method as described here. In other words, all features disclosed for the component are also disclosed for the method and vice versa.

According to at least one embodiment of the method, the plurality of semiconductor units with the plurality of image points are prepared. Each semiconductor unit is applied on a growth substrate. The growth substrate can be e.g. a monocrystalline substrate, which can be formed using e.g. sapphire. Here it is possible that the image points of each semiconductor unit originate from a common semiconductor layer sequence, which was epitaxially grown on the growth substrate, wherein after the epitaxial growth a singulation into the image points can take place.

According to at least one embodiment of the method, the connection substrate is prepared with the mounting surface and the electrical contact structures. The semiconductor units are applied on the mounting surface of the connection substrate. The application of the semiconductor units takes place in such a way that the semiconductor units are arranged on the mounting surface at a distance from one another laterally, the distance between adjacent semiconductor units being at least 5 µm and no more than 55 µm, preferably at least 10 µm and no more than 20 µm. Furthermore, the image points are electrically controllable separately from one another.

According to at least one embodiment of the method, the growth substrate is at least partly detached. In particular the growth substrate can be detached completely, e.g. by means of an etching process or a laser lift-off process. In this case, only the light-emitting semiconductor layers of the image points remain on the connection substrate. Alternatively, it is possible that the growth substrate is thinned, e.g. by means of an etching process or by physical erosion such as grinding or polishing. In this case, parts of the growth substrate remain on the image points.

According to at least one embodiment of the method for producing a component, this method comprises the following method steps:

preparing a plurality of semiconductor units, each comprising a plurality of monolithically integrated image points each having an active layer, which emits light during operation, wherein each semiconductor unit is applied on a growth substrate in each case, preparing a connection substrate having a mounting surface and electrical contact structures, applying the semiconductor units on the mounting surface in such a way that the semiconductor units are arranged on the mounting surface at a distance from one another laterally, wherein a distance between adjacent semiconductor units is at least 5 µm and no more than 55 µm and the image points are separately electrically controllable, at least partly detaching the growth substrate.

The method steps can be performed in the specified order.

According to at least one embodiment of the method, the semiconductor units are prepared by means of singulation from a wafer composite having a plurality of image points. For example, the singulation takes place by means of sawing, by means of scribing and breaking or by means of laser cutting.

According to at least one embodiment of the method, the preparation of the semiconductor units includes detecting semiconductor units having defective image points and separating out the semiconductor units having defective image points in such a way that, within the limits of manufacturing tolerances, exclusively semiconductor units having intact image points are applied on the mounting surface. In other words, the method comprises a selection of intact image points. As a result, it can be ensured that only fully functional semiconductor units are transferred on to the connection substrate.

A defective image point is distinguished e.g. by the fact that it has a lower luminous density and/or a lower luminous flux or a higher voltage drop than intact image points. For example, a defective image point does not emit any light.

For example, the image points are produced in a wafer composite, wherein an epitaxial growth is followed by a singulation step into semiconductor units. The detection of the semiconductor units having defective image points can take place before or after singulation. For example, it is possible to identify defective image points before the singulation and to remove these from the wafer composite during singulation. Alternatively, it is possible to carry out the singulation into individual semiconductor units first and then to separate out semiconductor units having defective image points.

With the method for producing a component described here and the component described here, the idea being pursued is in particular to combine the monolithic production of image points with the individual placing of semiconductor units on a connection substrate. This enables a component to be prepared with a high number of image points, which are positioned on a connection substrate at a small distance from one another.

In contrast to exclusively monolithically produced, highly pixelated components, the division into individual semiconductor units permits a selection of defective semiconductor units. This enables defective image points, which have e.g. defects in the semiconductor material or in the structure in a randomly distributed manner, to be separated out before being transferred on to the connection substrate. As a result, the yield of fully functional components with a correspondingly large light-emitting surface area increases considerably.

Furthermore, in contrast to the individual placing of image points, a small distance between the image points is possible. This makes it possible to dispense with the use of further lenses or enables the number of further lenses to be reduced considerably. In addition, by dividing the total light-emitting surface area needed into multiple semiconductor units and/or multiple semiconductor chips as desired, freedom in the design of the component is made possible. The number and/or arrangement of the image points within a semiconductor unit and/or within a semiconductor chip can be selected here such that, depending on the joining process selected and/or the defect rate of the image points, an optimum yield and therefore an optimum cost position can be achieved.

BRIEF DESCRIPTION OF THE FIGURES

The component described here and the method described here are explained in more detail below with the aid of exemplary embodiments and the associated figures.

FIGS. 2A, 2B, 2C and 2D are schematic diagrams of an exemplary embodiment of a method as described here for producing a component and an exemplary embodiment of a component as described here are explained in more detail.

Identical or similar elements or elements having the same effect are provided with the same reference numbers in the figures. The figures and the size ratios to one another of the elements illustrated in the figures should not be considered as being to scale. Rather, to illustrate them better and/or to make them easier to understand, the size of individual elements may be exaggerated.

Figure 1A:
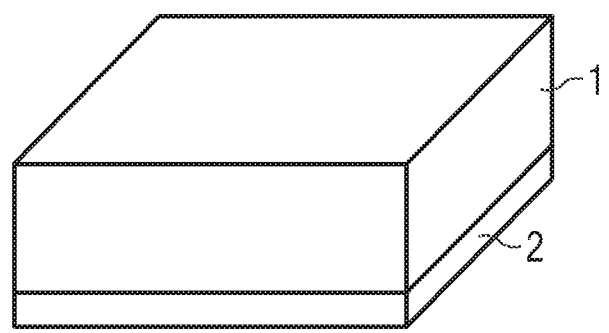
FIGS. 1A and 1B are schematic diagrams of an exemplary embodiment of a semiconductor unit as described here of a component as described here is explained in more detail.
Figure 1B:
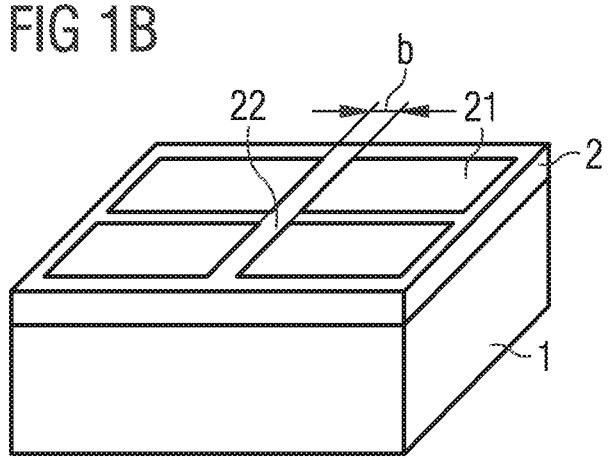

With the aid of the schematic diagrams of FIGS. 1A and 1B, an exemplary embodiment of a semiconductor unit of a component as described here is explained in more detail. The exemplary embodiment is shown in FIG. 1B rotated by 180° compared to FIG. 1A.

On a growth substrate 1, a semiconductor unit 2 (shown only schematically in the figures) is applied. The semiconductor unit 2 comprises a plurality of image points 21. The image points 21 are spaced apart from one another by separation trenches 22. The width B of the separation trenches 22 is at least 5 µm and no more than 25 µm.

Each image point 21 can comprise an n-type layer, a p-type layer and an active layer. For example, the n-type layer and the p-type layer originate from an n-type semiconductor layer and a p-type semiconductor layer. Here it is possible that the n-type layer or the p-type layer corresponds to the n-type semiconductor layer or the p-type semiconductor layer. For example, the n-type semiconductor layer and the p-type semiconductor layer are formed using a (joining) semiconductor material or consist of such a material.

With the aid of the schematic diagrams of FIGS. 2A, 2B, 2C and 2D, an exemplary embodiment of a method as described here for producing a component is explained in more detail.

In the method step illustrated in FIG. 2A, a semiconductor unit 2 applied on a growth substrate 1 is prepared and provided with first solder balls 31, which can be formed using a soldering metal.

In the method step illustrated in FIG. 2B, a connection substrate 4 having a mounting surface 4a is prepared. On the mounting surface 4a, connection regions 33 are predefined, which are provided with connection surfaces 32 which can be arranged to correspond to the first solder balls 31. The connection surfaces 32 can be formed using a metal or can consist of a metal. On each connection region 33, a semiconductor unit 2 is applied together with the growth substrate 1. Next, a heating of the first solder balls 31 and the connection surfaces 32 can take place, whereby the semiconductor units 2 and in particular the image points 21 can be mechanically and/or electrically connected to the connection substrate 4. Alternatively or in addition, a mechanical and/or an electrical connection of the semiconductor units 2 and in particular of the image points 21 can take place by means of bonding.

Figure 2C:
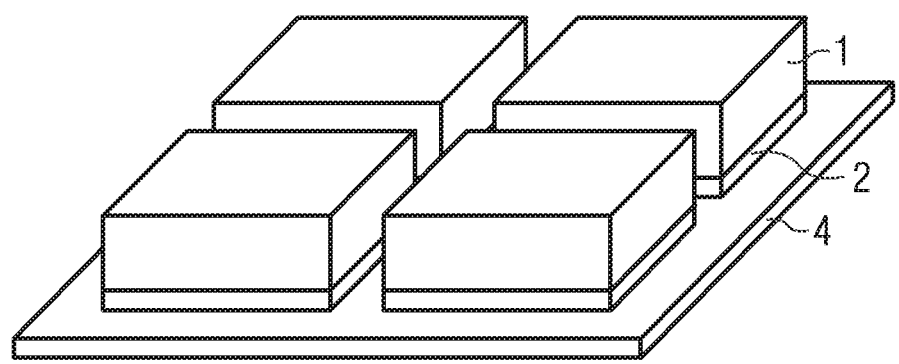

In the method step illustrated in FIG. 2C, a plurality of semiconductor units 2, each provided with a growth substrate 1, are applied on the mounting surface 4a of the connection substrate 4.

Figure 2D:
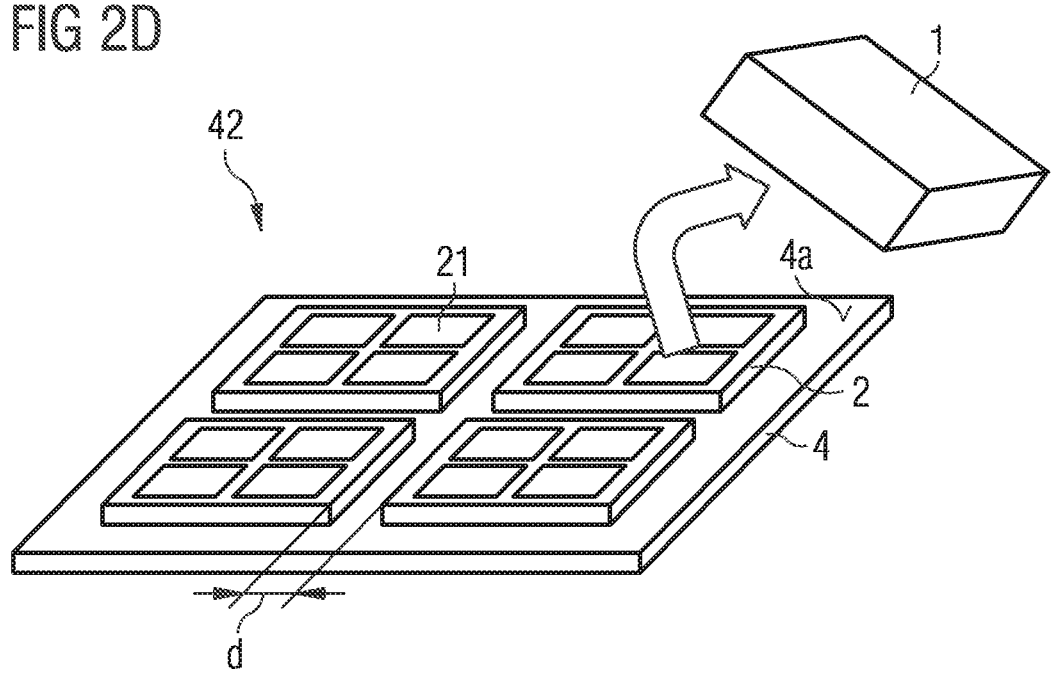

In the method step illustrated in FIG. 2D, the growth substrates 1 are detached from the semiconductor units 2. Alternatively, the growth substrates 1 can be only partly detached or thinned. The plurality of semiconductor units 2 each having a plurality of image points 21 then form a semiconductor chip 42 together with the connection substrate 4. The semiconductor units 2 of the semiconductor chip 42 are arranged on the mounting surface 4a of the connection substrate 4 at a distance from one another laterally. A distance d between adjacent semiconductor units 2 is at least 5 µm and no more than 55 µm.

Figure 3:
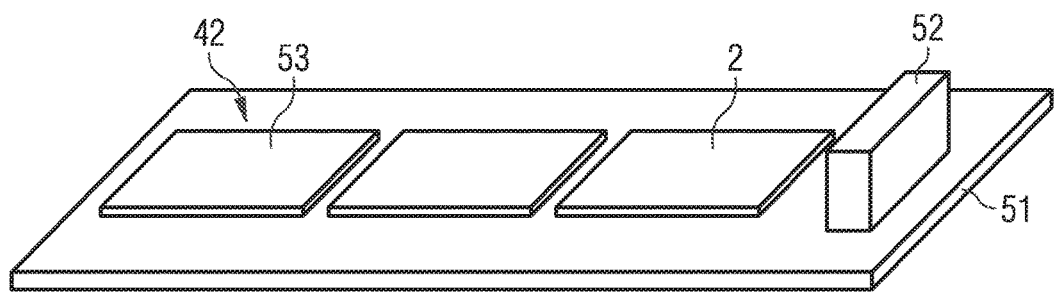
FIGS. 3, 4A, 4B and 4C are schematic diagrams of exemplary embodiments of a component as described here are explained in more detail.

With the aid of the schematic diagram of FIG. 3, an exemplary embodiment of a component as described here is explained in more detail. The component comprises a plurality of semiconductor chips 42, which are jointly applied on a printed circuit board 51. On a top surface of each of the semiconductor units 2 of the semiconductor chips 42 facing away from the printed circuit board 51, a conversion element 53 is applied. The conversion element 53 can be a ceramic pad or a polymer layer with wavelength-converting particles.

By means of an electrical interface 52, an electrical connection and/or control of the connection substrates 4 of the semiconductor chips 42 and in particular of the individual image points 21 of the semiconductor units 2 can take place. In particular, the electrical connection of the connection substrate 4 can take place after applying the connection substrate 4 on the printed circuit board 51 from the upper side facing away from the printed circuit board 51, for example by means of bond wires, which lead to bond pads arranged on the upper side. Alternatively, the connection substrate 4 can be provided with contact vias. In this case, the component can be a surface-mountable device (SMD).

Figure 4A:
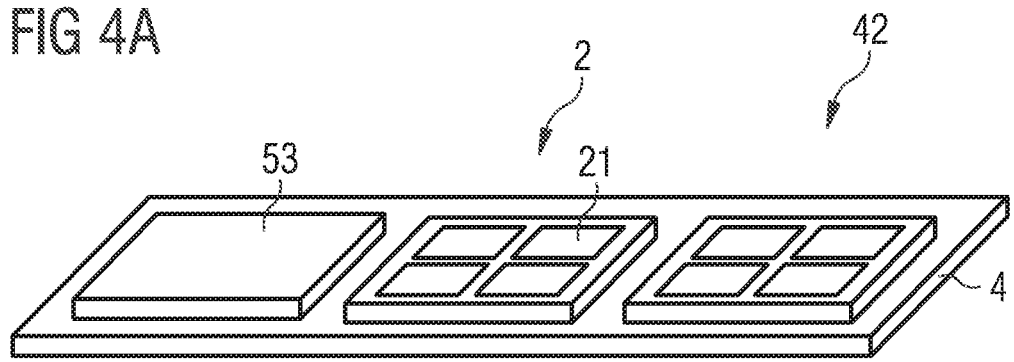
Figure 4B:
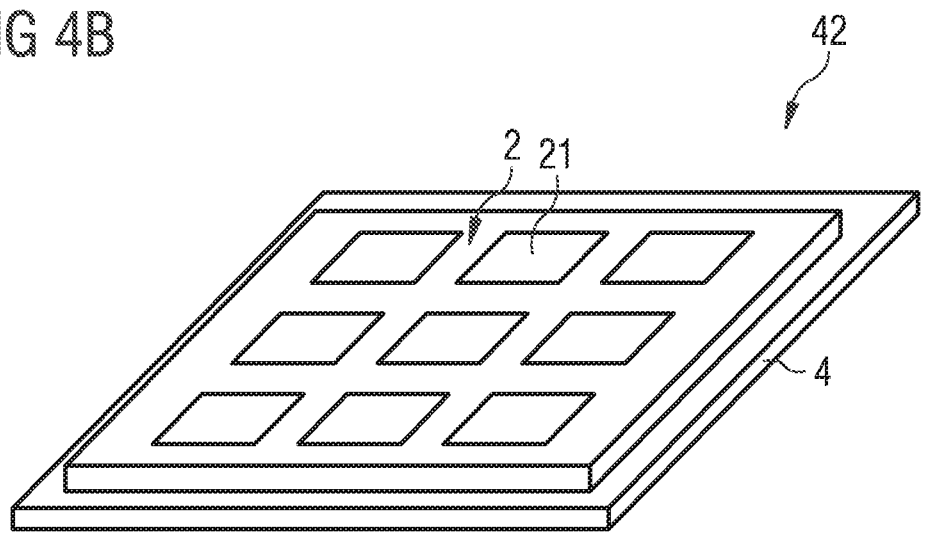
Figure 4C:
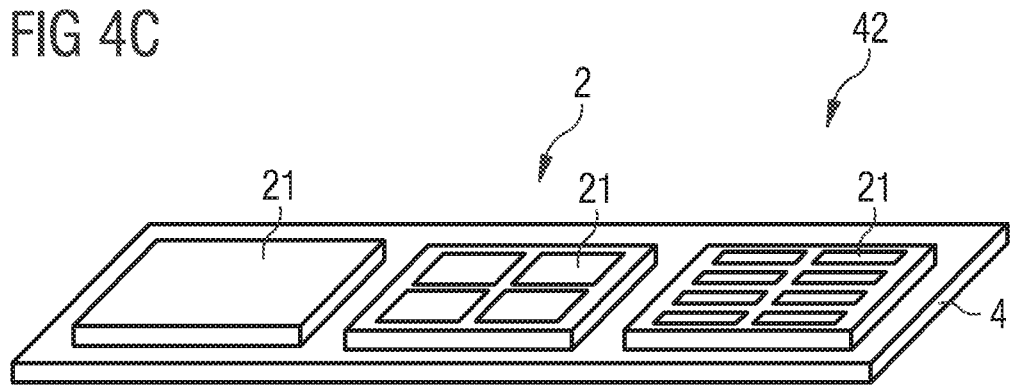

With the aid of the schematic diagrams of FIGS. 4A, 4B and 4C, exemplary embodiments of a semiconductor chip 42 for a component as described here are explained in more detail.

FIG. 4A shows a semiconductor chip 42 having a plurality of semiconductor units 2, each comprising a plurality of image points 21. The semiconductor units 2 are applied on a connection substrate 4. As illustrated in FIG. 4A, each of the semiconductor units 2 can have an identical number of image points 21. Furthermore, the semiconductor units 2 can have similar or identical sizes. On a top surface of the semiconductor units 2 facing away from the connection substrate 4, a conversion element 53 can be applied.

In the exemplary embodiment illustrated in FIG. 4B, the semiconductor chip 42 comprises only a single semiconductor unit 2 having a plurality of image points 21. The semiconductor unit 2 may optionally comprise a conversion element 53 on its top surface (not illustrated in FIG. 2B).

In the exemplary embodiment illustrated in FIG. 4C, the semiconductor chip 42 comprises a plurality of semiconductor units 2, the semiconductor units 2 having different numbers of image points 21 each with different sizes.

This patent application claims the priority of the German patent application 102015115812.4, the disclosure content of which is hereby incorporated by reference.

The description with the aid of the exemplary embodiments does not limit the invention thereto. Rather, the invention comprises any new feature and any combination of features, which in particular includes any combination of features in the patent claims, even if these features are not themselves or this combination is not itself explicitly stated in the patent claims or exemplary embodiments.

LIST OF REFERENCE NUMERALS

1 Growth substrate
2 Semiconductor unit
21 Image point
22 Separation trench
B Width
d Distance
31 First solder balls
32 Connection surfaces
33 Connection region
4 Connection substrate
4a Mounting surface
42 Optoelectronic semiconductor chip
51 Printed circuit board
52 Electrical interface
53 Conversion element

The invention claimed is:

1. A component comprising at least one optoelectronic semiconductor chip having
a connection substrate comprising a mounting surface and electrical contact structures and
a plurality of structured semiconductor units, each comprising a plurality of monolithically integrated image points each having an active layer which emits light during operation, wherein
the semiconductor units are arranged on the mounting surface at a distance from one another laterally and
the image points are separately electrically controllable, wherein
each image point is electrically connected to at least one semiconductor contact,
each image point is associated with a respective electrical contact structure, and
the electrical contact structure associated with an image point can be electrically connected to the semiconductor contact of the respective image point.

2. The component according to claim 1,
in which a distance (d) between adjacent semiconductor units is at least 5 μm and no more than 55 μm.

3. The component according to claim 1, in which
the active layers of the image points are in a monolithically integrated form and
the image points are separately electrically controllable by means of multiple semiconductor contacts which are at a distance from one another laterally, wherein
a distance (a) between adjacent semiconductor contacts is at least 1 μm and no more than 25 μm.

4. The component according to claim 1,
in which, between the active layers of adjacent image points, a separation trench having a width (B) of at least 5 μm and no more than 25 μm is arranged in each case.

5. The component according to claim 4,
in which the image points are optically separate from one another.

6. The component according to claim 1,
in which at least two of the semiconductor units comprise different numbers of image points.

7. The component according to claim 1,
in which the connection substrate comprises at least one integrated circuit.

8. The component according to claim 1,
in which the connection substrate contains a plurality of current sources, wherein each of the current sources is uniquely associated with one of the image points and is electrically connected to this image point.

9. The component according to claim 1,
in which the distance between adjacent semiconductor units deviates by no more than +/−10% from an average width of the separation trenches.

10. The component according to claim 1,
in which the distances between adjacent semiconductor units deviate by no more than +/−10% from an average distance (a) between adjacent semiconductor units.

11. The component according to claim 1,
in which a light-emitting surface area of the component is at least 8 mm$^2$, preferably at least 40 mm$^2$.

12. The component according to claim 1,
in which a total number of image points of the component is at least 128, preferably at least 2500, and/or a luminous flux of the light emitted by the total number of the image points is at least 1600 lumen, preferably at least 6400 lumen.

13. The component according to claim 1,
comprising at least two optoelectronic semiconductor chips, which are arranged on a printed circuit board.

14. A method for producing a component, comprising the following method steps:
preparing a plurality of semiconductor units, each comprising a plurality of monolithically produced image points each having an active layer which emits light during operation, wherein each semiconductor unit is applied on a growth substrate in each case;
preparing a connection substrate having a mounting surface and electrical contact structures,
applying the semiconductor units on the mounting surface in such a way that the semiconductor units are arranged on the mounting surface at a distance from one another laterally, wherein
a distance (d) between adjacent semiconductor units is at least 5 μm and no more than 55 μm and
the image points are separately electrically controllable, wherein
each image point is electrically connected to at least one semiconductor contact,
each image point is associated with a respective electrical contact structure, and
the electrical contact structure associated with an image point can be electrically connected to the semiconductor contact of the respective image point; and
at least partly detaching the growth substrate.

15. The method according to claim 14,
wherein the semiconductor units are prepared by means of singulation from a wafer composite having a plurality of image points.

16. The method according to claim 15,
wherein the preparation of the semiconductor units furthermore comprises the following method steps:

detecting semiconductor units having defective image points, separating out the semiconductor units having defective image points in such a way that, within the limits of manufacturing tolerances, exclusively semiconductor units having intact image points are applied on the mounting surface.

17. The method according to claim 14, wherein between the active layers of adjacent image points, a separation trench having a width (B) of at least 5 μm and no more than 25 μm is arranged in each case, and wherein the distance between adjacent semiconductor units deviates by no more than +/−10% from an average width of the separation trenches.

18. A component comprising at least one optoelectronic semiconductor chip having a connection substrate comprising a mounting surface and electrical contact structures and a plurality of structured semiconductor units, each comprising a plurality of monolithically integrated image points each having an active layer which emits light during operation, wherein the semiconductor units are arranged on the mounting surface at a distance from one another laterally, the image points are separately electrically controllable, wherein each image point is electrically connected to at least one semiconductor contact, each image point is associated with a respective electrical contact structure; and the electrical contact structure associated with an image point can be electrically connected to the semiconductor contact of the respective image point, between the active layers of adjacent image points, a separation trench having a width (B) of at least 5 μm and no more than 25 μm is arranged in each case, and the distance between adjacent semiconductor units deviates by no more than +/−10% from an average width of the separation trenches.

\* \* \* \* \*